ically homogeneous magnetic field for use in magnetic resonance imaging. The magnet system includes a vacuum vessel, a cryogenic containment vessel inside the vacuum vessel and having a coil of superconductive wire along with a quantity of liquid helium to maintain the wire below its critical temperature. The system also includes an inner thermal radiation shield between the containment vessel and the vacuum vessel and an outer thermal radiation shield between the inner shield and the vacuum vessel. A cryogenic refrigerator is supported by the vacuum vessel and extends inside. This refrigerator has a first-stage heat station cooling the outer shield and second-stage heat station for cooling the inner shield. The improvement includes the provision of a tank holding a quantity of liquid nitrogen. This tank is supported in good heat transfer relationship with the first-stage heat station between the vacuum vessel and the outer shield and is spaced from the outer shield. Tubing is provided for transferring the liquid nitrogen from the tank so that it boils in good heat transfer relationship with the outer shield and also returns gas resulting from the boiling of the liquid nitrogen back to the tank where the refrigerator condenses it in the tank. A method of using the cooling apparatus in the event the refrigerator is not functional, is also disclosed.

United States Patent

Breneman et al.

[11] Patent Number: 4,782,671
[45] Date of Patent: Nov. 8, 1988

[54] COOLING APPARATUS FOR MRI MAGNET SYSTEM AND METHOD OF USE

[75] Inventors: Bruce C. Breneman; Raymond E. Sarwinski, both of San Diego, Calif.

[73] Assignee: General Atomics, San Diego, Calif.

[21] Appl. No.: 101,516

[22] Filed: Sep. 28, 1987

[51] Int. Cl.⁴ ............................................. F25B 19/00
[52] U.S. Cl. ................................................. 62/514 R
[58] Field of Search ............................ 62/514 R, 45

[56] References Cited

U.S. PATENT DOCUMENTS

| | | | |
|---|---|---|---|
| 4,502,296 | 3/1985 | Ogata et al. | 62/514 R |
| 4,510,771 | 4/1985 | Matsuda et al. | 62/514 R |
| 4,535,595 | 8/1985 | Keller et al. | 62/3 |
| 4,537,033 | 8/1985 | Kamil | 62/3 |
| 4,652,824 | 3/1987 | Oppelt | 62/514 R |
| 4,655,045 | 4/1987 | Matsumoto et al. | 62/514 R |
| 4,680,936 | 7/1987 | Sarwinski et al. | 62/45 |

Primary Examiner—Ronald C. Capossela
Attorney, Agent, or Firm—Fitch, Even, Tabin & Flannery

[57] ABSTRACT

An improvement in cooling apparatus in a magnet system for providing a localized, substantially homogene- 9 Claims, 3 Drawing Sheets

COOLING APPARATUS FOR MRI MAGNET SYSTEM AND METHOD OF USE

This invention relates to cooling apparatus and, more particularly, to cooling apparatus for use in a magnetic resonance imaging (MRI) magnetic system for reducing and/or eliminating cryogenic boil off and maintaining a thermal radiation shield at a substantially constant temperature.

BACKGROUND OF THE INVENTION

MRI magnet systems typically include a cylindrical vacuum vessel having a bore for receiving the subject of the imaging. A cryostat or cryogenic containment vessel inside this vacuum vessel houses the superconductive coil which provides the high strength, substantially homogeneous magnetic field necessary for the imaging. The cryostat also contains liquid helium for maintaining the coil below its critical temperature. Also there is at least one thermal radiation shield between the cryostat and the vacuum vessel. Gradient coils, which are disposed inside the bore, are pulsed and operate to determine spatial position in the imaging process. The first wall of the vacuum vessel (the cylindrical wall directly defining the bore and providing a vacuum/atmosphere interface) should be substantially "transparent" to signals generated by the gradient coils so that the induced eddy currents decay quickly.

One of the functions of the intermediate shield is to stop these signals so they do not reach the cryostat where they would generate eddy currents resulting in heating of the helium cryostat thus increasing the consumption of expensive liquid helium. However, the eddy current generation at the thermal radiation shield requires a compensation in the pulsing of the gradient coils. Since the resistivity of the material of the shield is a function of temperature and affects the generation of eddy currents, it is desirable to maintain the temperature of the shield constant so as to maintain a constant eddy current compensation.

It is known to cool the thermal radiation shield with liquid nitrogen. However, the boiling of the liquid nitrogen requires frequent addition to the magnet system. It has also been proposed to connect the cold head of a cryogenic refrigerator to the thermal radiation shield through conduction. However the output of the refrigerator can vary affecting the temperature of the shield. For further information regarding the structure and operation of this cooling apparatus, reference may be made to U.S. Pat. No. 4,537,033.

Another cooling apparatus for an MRI magnet system includes a two-stage cryogenic refrigerator mounted on the vacuum vessel in which the first stage cools a liquid nitrogen tank with liquid nitrogen supplied to cool the outer radiation shield. The colder second stage cools an inner radiation shield. Yet another cooling apparatus includes a single stage cryogenic refrigerator physically spaced from the vacuum vessel for liquefying neon and returning it to a tank inside the vacuum vessel. The tank is part of a thermal siphon for cooling the shield. For further information concerning such cooling equipment for MRI magnet systems, reference may be made to U.S. Pat. Nos. 4,535,595 and 4,680,936, respectively.

SUMMARY OF THE INVENTION

Among the various aspects of the present invention may be noted the provision of improved cooling apparatus for use in an MRI magnet system. The cooling apparatus operates to maintain an outer radiation shield at a substantially constant low temperature, eliminating liquid nitrogen boil off, reducing boil off rate of the helium in the cryostat and allowing for constant eddy current compensation required by the pulsing of gradient coils. So long as the cryogenic refrigerator carried by the vacuum vessel is functioning properly, the cooling apparatus operates in a closed cycle mode so that there is no need for the addition of liquid nitrogen. However if the refrigerator is not functioning, because it is broken, it is undergoing maintenance or because there is a loss of power, imaging can continue because the cooling apparatus has an open cycle capability. In order for the magnet system to operate in its open cycle mode, the liquid nitrogen tank for cooling the outer radiation shield is opened and an external Dewar (storage tank) is connected to supply liquid nitrogen to the fill port of the tank, the vent port for the liquid nitrogen tank is opened, and helium gas from the helium cryostat is vented to cool the inner thermal radiation shield. The cooling apparatus of the present invention is reliable in use, has long service life and is relatively easy and economical to manufacture. Other aspects and features of the present invention will be, in part, apparent and, in part, pointed out specifically in the following specification and in the accompanying drawings.

Briefly, the magnet system embodying various features of the present invention includes a vacuum vessel including a first wall defining a bore for receiving the subject of the imaging and a cryogenic containment vessel supported within the vacuum vessel. The containment vessel holds a coil formed of superconductive wire for providing the magnetic field along with a quantity of liquid helium which maintains the wire below its critical temperature. An inner thermal radiation shield is disposed between the vessels, and an outer thermal radiation shield is positioned between the inner shield and the vacuum vessel. A cryogenic refrigerator supported by the vacuum vessel has a first-stage heat station for cooling the outer shield and a second-stage heat station for cooling the inner shield. The magnet system also includes a thermal siphon having a tank holding a quantity of liquid nitrogen. The tank is supported in good heat transfer relationship with the first-stage heat station and the thermal siphon has means for transferring the liquid nitrogen from the tank so that it boils in good heat transfer relationship with the outer shield. The thermal siphon also includes means for returning nitrogen gas resulting from the boiling back to the tank where it is condensed by operation of the refrigerator. Finally, the magnet system includes a vent for allowing for escaping gas from tank and a fill port for adding liquid nitrogen.

As a method of cooling the outer thermal radiation shield, the present invention includes the following steps:

(A) When electric power is available to operate the refrigerator, the refrigerator is used to cool the outer shield;

(B) However, when electric power for the refrigerator is unavailable or repair of the refrigerator is necessary, liquid nitrogen is supplied into the tank using a normally closed fill port, and nitrogen gas is vented through a normally closed vent port. An additional vent port is also opened to allow open cycle helium boil off gas to cool the inner thermal radiation shield. This allows for continual imaging, during the time the refrigerator is not functioning, while maintaining the outer shield at constant temperature.

BRIEF DESCRIPTION OF THE DRAWINGS

Corresponding reference characters indicate corresponding components throughout the several views of the drawings.

DETAILED DESCRIPTION OF THE PREFERRED EMBODIMENT

Figure 1:
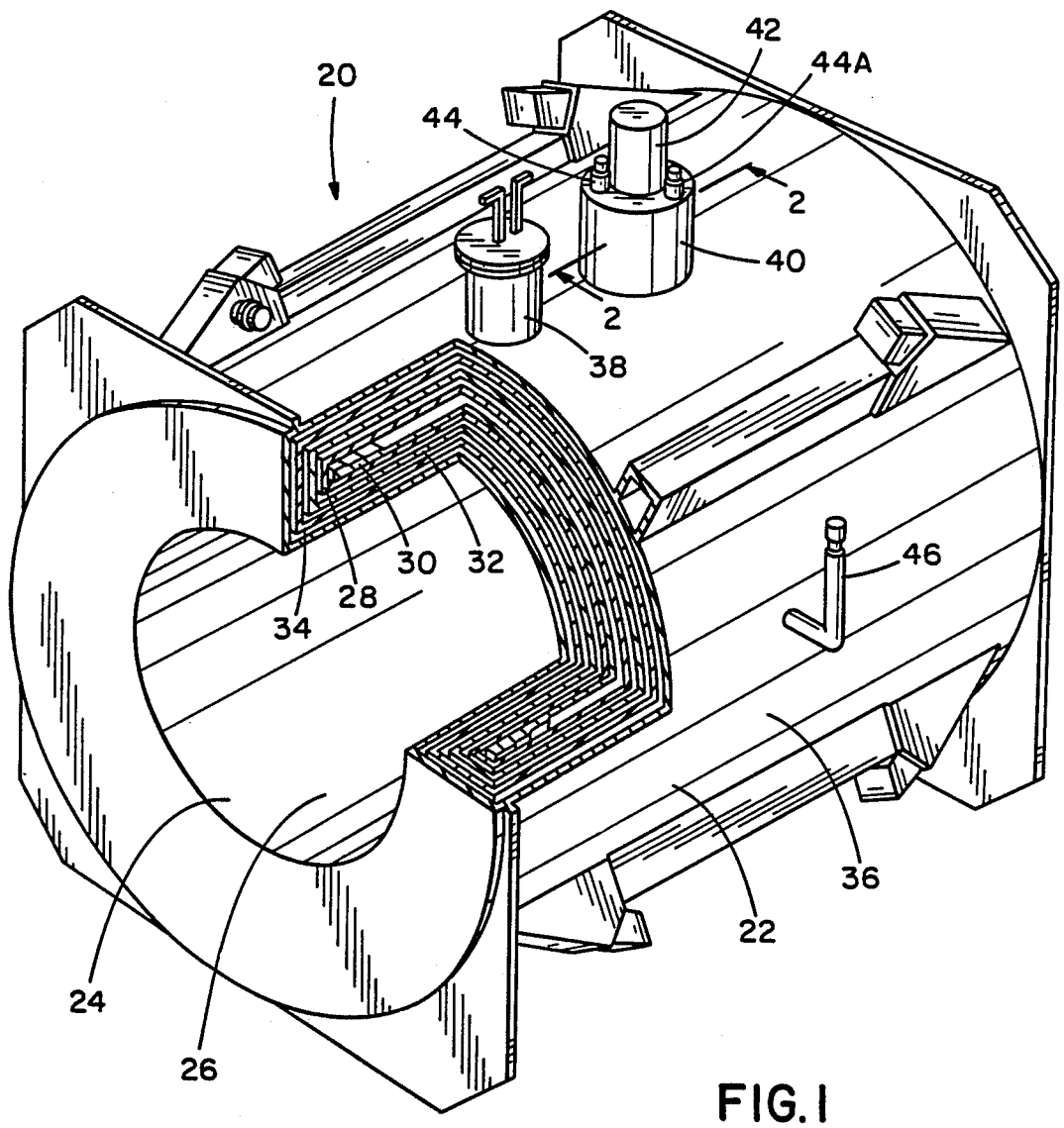
FIG. 1 is an isometric projection of an MRI magnet system having cooling apparatus embodying various aspects of the present invention, with certain components broken away to expose other components.

Referring to the drawings, a magnet system incorporating cooling apparatus embodying various features of the present invention is generally indicated in FIG. 1 by reference numeral 20. The magnet system includes a vacuum vessel 22 including a cylindrical first wall 24 defining a bore 26 for receiving the subject of the imaging. A vacuum (0 psia) is maintained inside the vacuum vessel, the outside of the vessel being at ambient temperature (about 300° K.). Disposed within the vessel 22 is a cryostat or cryogenic containment vessel 28 housing the coil 30 of superconductive wire for providing the high strength, substantially homogeneous magnetic field in a predetermined location in the bore, along with liquid helium to maintain the wire below its critical temperature to conduct current without resistance.

The magnet system also includes an inner thermal radiation shield 32, also known as a 20° K. shield, disposed between containment vessel 28 and vacuum vessel 22. An outer thermal radiation shield 34, also known as an 80° K. shield is positioned between the inner shield 32 and the vacuum vessel 22. Each shield is made up of an inner tube, an outer tube and annular end pieces joining the respective tubes. A preferable construction material for the radiation shields is an aluminum alloy which is a good thermal and electrical conductor. Space between the various vessels and shields may contain so-called "superinsulation", not shown, formed of insulating material, such as aluminized Mylar (a registered trademark of DuPont for polyester), which further reduce the transmission of thermal energy to the liquid helium.

Figure 2:
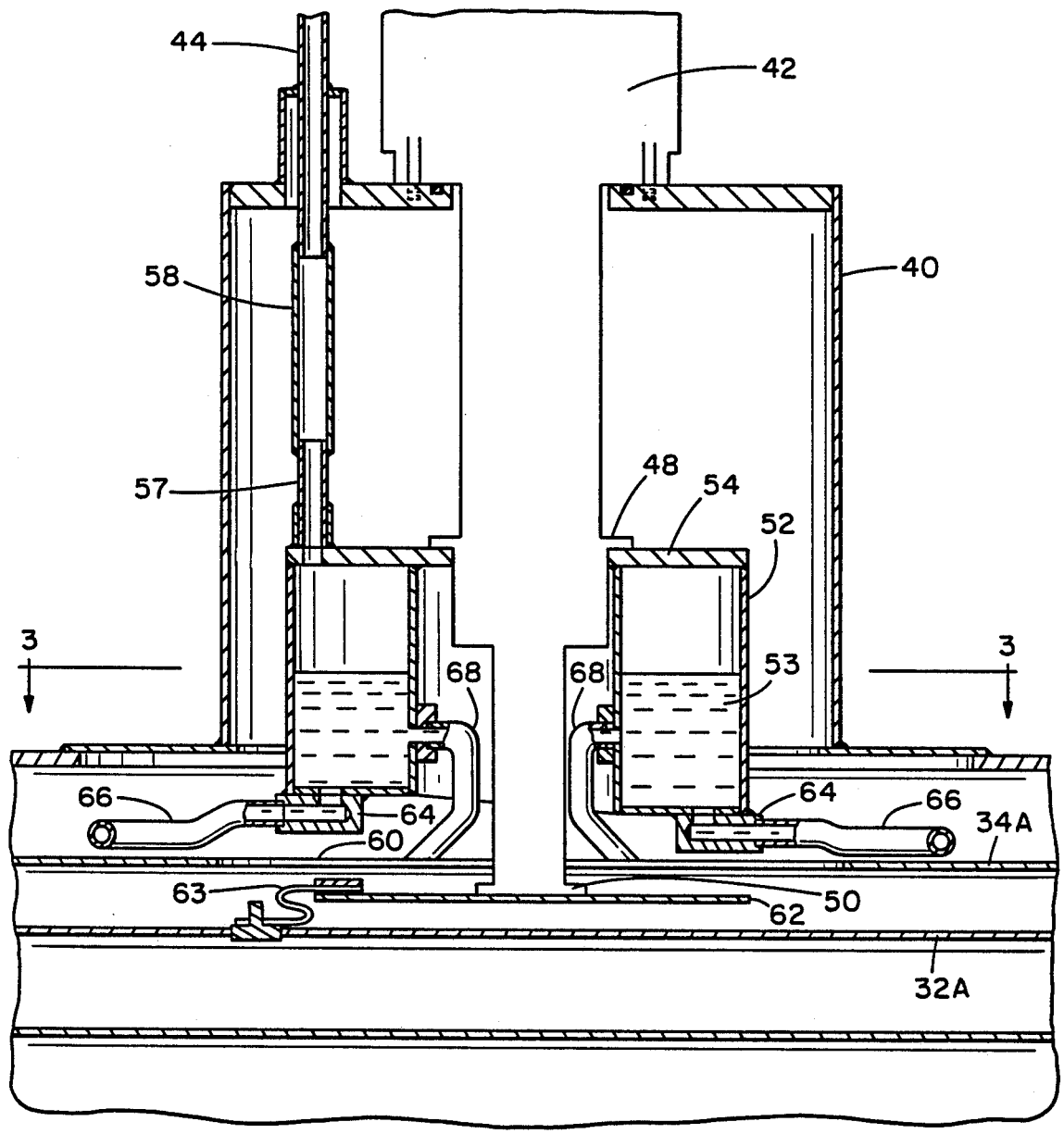
FIG. 2 is a partial cross-sectional view taken generally along line 2—2 in FIG. 1 to show a cryogenic refrigerator and a liquid nitrogen tank.
Figure 3:
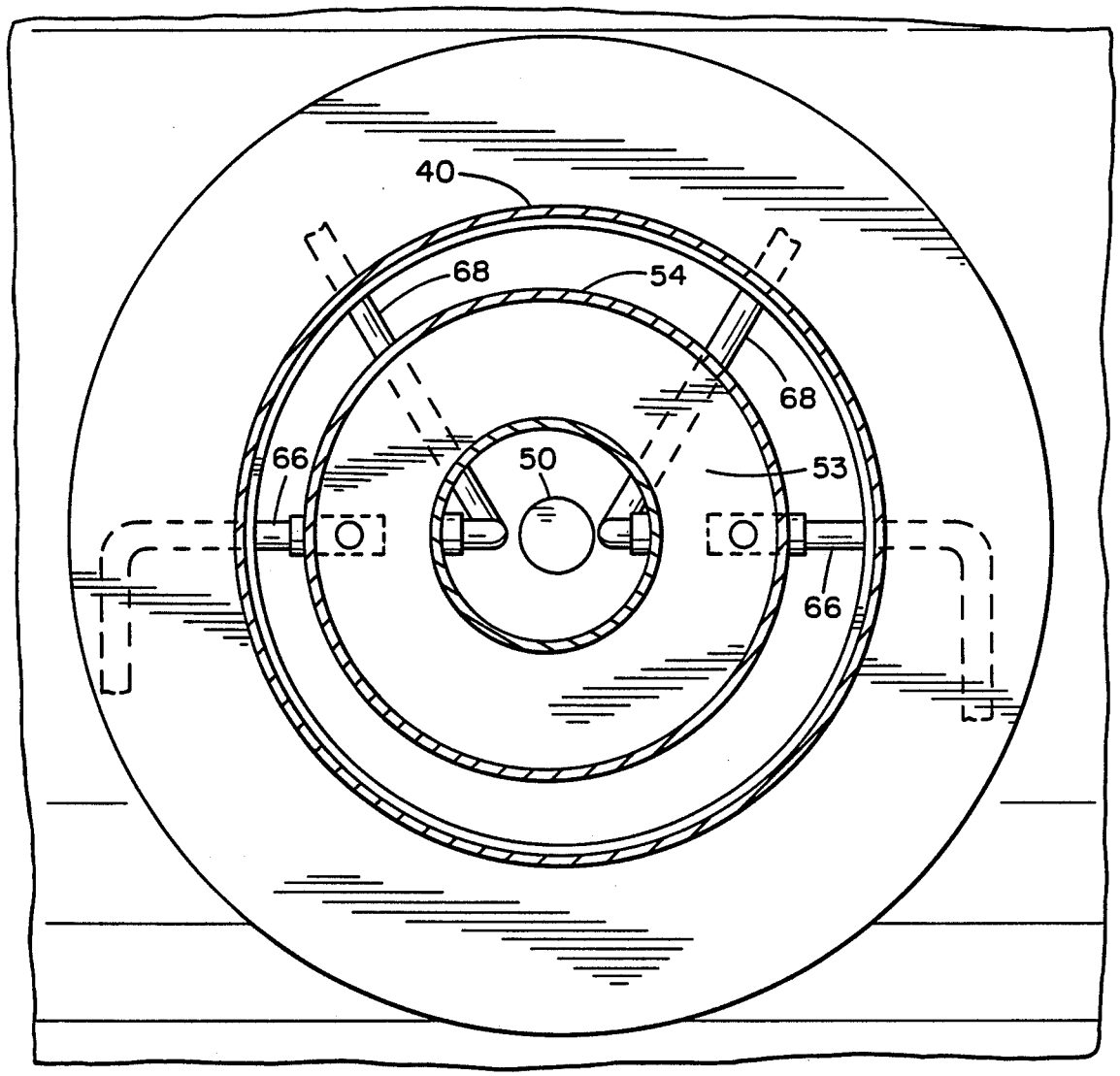
FIG. 3 is a sectional view taken generally along line 3—3 of FIG. 2.

Extending from the outer wall 36 of the vacuum vessel are a first turret 38 for receiving the power leads for the coil 30 and other electrical connections, a second turret 40 supporting a cryogenic refrigerator 42 and a liquid nitrogen vent port 44 and fill port 44A, and a liquid helium fill port 46. Referring to FIG. 2, the commercially available refrigerator 42 (which may be Model No. 208 manufactured by APD Crogenics, Inc.) has a first-stage heat station 48 which operates at a sufficiently cold temperature to condense nitrogen (liquid nitrogen boils at 77.3° K.) and a second stage heat station 50 which operates at about 20° K. The first-stage heat station 48 supports and is in good thermal contact with a small annular tank 52 which may contain about 1 to 100 liters of liquid nitrogen 53. More specifically, a plate 54 of material, such as an aluminum alloy, having good thermal conductivity, is attached to station 48, for example, by bolts (not shown). Malleable gaskets of material which is a good thermal conductor, such as indium or gallium, may be used between the plate and heat station. The tank 52 is dependent from plate 54, and the vent port 44 communicates with the tank through an aperture 56 in the plate by means of tubing 57. The port 44 may be opened to atmosphere to maintain the tank 52 at atmospheric pressure. The tubing 57 includes a flexible section 58 to relieve stresses that would otherwise occur due to contraction as the various components are cooled to their operating temperatures. Additionally, this section is extensible to permit lifting the refrigerator 42 to permit replacement of O-rings. The fill port 44A and its connection to the tank 52 may be identical to that of the vent port 44.

The second-stage heat station 50 extends through a large window 60 in the outer shell 34A of the outer radiation shield 34 and is connected to a foot 62 of material having good thermal conductivity. The foot 62 is in turn connected to the outer shell 32A of the inner radiation shield by a flexible thermal tie, which is preferably a tinned copper braid 63 to provide for good thermal conduction and to allow for relative motion between outer shell 32A and turret 40.

The liquid nitrogen tank 52, which is spaced from the outer shield 32, is part of a thermal siphon for maintaining the outer shield 34 at a constant temperature, 77.3° K. which is the boiling point of liquid nitrogen at atmospheric pressure, 15 psia. Such a thermal siphon is described in commonly-assigned U.S. Pat. No. 4,680,936, the teachings of which are incorporated herein by reference. The siphon also includes means for transferring the liquid nitrogen from tank 52 so that it boils in good heat transfer relationship with the outer shield 34, and means for returning the gas resulting from the boiling of the liquid nitrogen back to the tank so that the gas is condensed in the tank by operating of the refrigerator 42.

Figure 4:
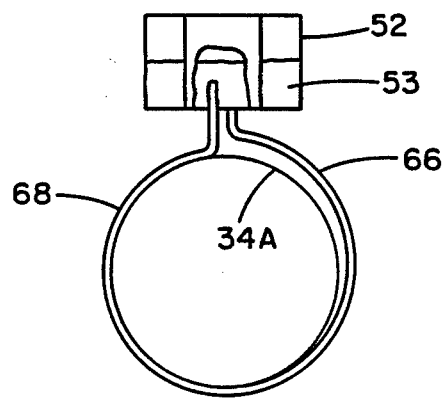
FIG. 4 is a simplified drawing showing the components of a thermal siphon including the liquid nitrogen tank.

More specifically, the base of tank 52 is provided with outlet ports 64 supplying liquid nitrogen to two tubing lines each having a down leg 66 and an up leg 68, for returning the gas resulting from boiling back to the tank. Referring to the simplified drawing of FIG. 4, the down leg 66 is out of contact with shell 34A of the outer thermal shield 34 while the up leg 68 is in contact with the shell. The tubing 66 is made of material such as stainless steel having relatively poor thermal conductivity, while the tubing leg 68 is of a good thermal conductive material, such as aluminum. In operation of the siphon, liquid nitrogen flow out ports 44 through down legs 66 and into up legs 68. The liquid nitrogen receives sufficient heat in the up legs due to good thermal conduction causing it to boil. Liquid nitrogen boils at only one temperature 77.3° K., at atmospheric pressure thereby maintaining the outer thermal radiation shield at a constant temperature. The density difference of the nitrogen in the two legs causes the nitrogen to circulate.

The cooling apparatus of the present invention offers several advantages over known cooling equipment in MRI magnet systems. The boiling of the liquid nitrogen in direct thermal contact with the shell 34A of the outer radiation shield 34 maintains the shield at a constant temperature making for eddy current compensation required by the pulsing of gradient coils. Additionally, the tank 52 contains relatively a small amount of liquid nitrogen in contrast with the prior art liquid nitrogen containers which may contain 30 to 50 liters of liquid nitrogen. The ports 44 and 44A and associated tubing 57 extending through the vacuum vessel where the pressure is 0 psia to the tank 52 provides an open cycle capability for the cooling apparatus. During normal operating conditions where electrical power is available for the refrigerator 42 and it is operating properly, the refrigerator and thermal siphon are, in essence, in a closed cycle mode because there is no need to add additional liquid nitrogen as the nitrogen gas resulting from boiling of the liquid nitrogen is condensed inside the tank 52 by operation of the first-stage coolant station 48.

However, in an emergency situation where there is the loss of power to the cryogenic refrigerator 42, or repair of the cryogenic refrigerator is required, the imaging can continue. The ports 44 and 44A and tubing 57 permits the addition of liquid nitrogen, as well as venting of the nitrogen gas. Means (not shown) is preferably provided for indicating the liquid nitrogen level in the tank to identify the need for the addition of further liquid nitrogen.

The refrigerator 42 with its second stage connected to the 20° shield and its first stage operating to cool the 80° shield, results in efficient means for taking heat out of the magnet system which could otherwise reach the cryogenic containment vessel 28. With the cooling system of the present invention there is need to replenish the supply of liquid helium only about once every three months, thereby greatly reducing the maintenance needed for the magnet system.

As a method of operation, the present invention includes the following steps:

(A) When electric power is available, the cryogenic refrigerator 42 is used to cool the outer thermal radiation shield 34;

(B) However, when electrical power for the refrigerator is unavailable or repair of the refrigerator is required, liquid nitrogen is supplied into tank 52 using the ports 44 and 44A to maintain a supply of liquid nitrogen in the tank, and the 20° K. helium vent port is opened thereby maintaining the system cooled and allowing the continuation of imaging.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. An improvement in a magnet system for providing a localized, substantially homogeneous magnetic field for use in magnetic resonance imaging, said magnet system comprising:

a vacuum vessel including a first wall defining a bore for receiving the subject of the imaging;

a cryogenic containment vessel supported within said vacuum vessel and containing a coil formed of superconductive wire for providing said magnetic field along with a quantity of liquid helium to maintain said wire below its critical temperature;

an inner thermal radiation shield disposed between said containment vessel and said vacuum vessel;

an outer thermal radiation shield disposed between said inner shield and said vacuum vessel;

a cryocooler supported by said vacuum vessel and extending inside said vacuum vessel, said cryocooler having a first-stage heat station for cooling said outer shield and a second-stage heat station for cooling said inner shield, said improvement comprising:

a tank holding a quantity of a second liquid, which has a boiling point above liquid helium but well below ambient temperature, for cooling said outer shield, said tank being supported in good heat transfer relationship with said first-stage heat station between said vacuum vessel and said outer shield and spaced from said outer shield;

means for transferring said second liquid from said tank so that said second liquid boils in good heat transfer relationship with said outer shield; and means for returning gas resulting from the boiling of said second liquid back to said tank, said gas being cooled by said cryocooler to liquefy the gas in said tank.

2. An improvement as set forth in claim 1 wherein said tank is annular and is supported by said first-stage heat station.

3. An improvement as set forth in claim 1 wherein said second liquid is nitrogen.

4. An improvement as set forth in claim 1 wherein each of said shields comprises an outer cylindrical shell, an inner cylindrical shell and annular end plates joining said inner and outer shells, said outer shield outer shell having a window for passage of said second-stage heat station.

5. An improvement as set forth in claim 4 wherein said window is of sufficient size that the said last-mentioned station does not engage said outer shield outer shell.

6. An improvement as set forth in claim 1 wherein said tank, said means for transferring, and said means for returning constitute a thermal siphon.

7. A magnet system for providing a localized, substantially homogeneous magnetic field for use in magnetic resonance imaging, said magnet system comprising:

a vacuum vessel including a first wall defining a bore for receiving the subject of the imaging;

a cryogenic containment vessel supported within said vacuum vessel and containing a coil formed of superconductive wire for providing said magnetic field along with a quantity of liquid helium which maintains said wire below its critical temperature;

an inner thermal radiation shield disposed between said containment vessel and said vacuum vessel;

an outer thermal radiation shield disposed between said inner shield and said vacuum vessel;

a cryocooler supported by said vacuum vessel and extending inside said vacuum vessel, said cryocooler having a first-stage heat station for cooling said outer shield and a second-stage heat station for cooling said inner shield;

a thermal siphon including a tank holding a quantity of a second liquid, which has a boiling point above liquid helium but well below ambient temperature, for cooling said outer shield, said tank being supported in good heat transfer relationship with said first-stage heat station between said vacuum vessel and said outer shield and spaced from said outer shield, means for transferring said second liquid from said tank so that said second liquid boils in good heat transfer relationship with said outer shield, and means for returning gas resulting from the boiling of said second liquid back to said tank, said gas being cooled by said cryocooler to condense in said tank; and a vent for venting said tank to atmosphere.

8. A magnet system for providing a localized, substantially homogeneous magnetic field for use in magnetic resonance imaging, said magnet system comprising:

a vacuum vessel including a first wall defining a bore for receiving the subject of the imaging;

a cryogenic containment vessel supported within said vacuum vessel and containing a coil formed of superconductive wire for providing said magnetic field along with a quantity of liquid helium which maintains said wire below its critical temperature;

a thermal radiation shield disposed between said containment vessel and said vacuum vessel;

a cryocooler supported by said vacuum vessel and extending inside said vacuum vessel, said cryocooler having a heat station for cooling said shield;

a tank holding a quantity of liquid nitrogen, or cooling said shield, said tank being supported in good heat transfer relationship with said heat station and being spaced from said shield;

means for transferring said liquid nitrogen from said tank so that it boils in good heat transfer relationship with said outer shield;

means for returning gas resulting from the boiling of said liquid nitrogen back to said tank, said gas being cooled by said cryocooler to liquefy the gas in said tank; and a vent for venting said tank to atmosphere.

9. A method of cooling a thermal radiation shield in a magnet system for providing a localized, substantially homogeneous magnetic field for use in magnetic resonance imaging, said magnet system comprising:

a vacuum vessel including a first wall defining a bore for receiving the subject of the imaging;

a cryogenic containment vessel supported within said vacuum vessel and containing a coil formed of superconductive wire for providing said magnetic field along with a quantity of liquid helium, the boiling of which maintains said wire below its critical temperature;

said thermal radiation shield which is disposed between said containment vessel and said vacuum vessel;

an electrically powered cryocooler supported by said vacuum vessel and extending inside said vacuum vessel, said cryocooler having a heat station for cooling said shield;

a tank holding a quantity of liquid nitrogen for cooling said shield, said tank being supported in good heat transfer relationship with said heat station between said vacuum vessel and said shield and spaced from said outer shield;

means for transferring said liquid nitrogen from said tank so that it boils in good heat transfer relationship with said outer shield;

means for returning gas resulting from the boil of said liquid nitrogen back to said tank, said gas being cooled by said cryocooler to condense nitrogen in said tank; and vent and fill ports extending from said tank to outside said vacuum vessel for venting said tank to atmosphere and for supplying liquid nitrogen to said tank, said method comprising the following steps:

(a) when said cryocooler is functional, using said cryocooler to cool said shield, and (b) when said cryocooler is not functional, supplying liquid nitrogen into said tank using said fill port while venting nitrogen gas from said tank through said vent port so as to maintain a supply of liquid nitrogen in said tank.

* * * * *